United States Patent
Khitun et al.

(10) Patent No.: US 7,372,306 B1
(45) Date of Patent: May 13, 2008

(54) METHOD AND APPARATUS FOR STABILITY CONTROL USING FAST EXCITATION IN CIRCUITS HAVING ELEMENTS WITH NEGATIVE DIFFERENTIAL RESISTANCE

(75) Inventors: Alexander Khitun, Los Angeles, CA (US); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 184 days.

(21) Appl. No.: 11/354,587

(22) Filed: Feb. 14, 2006

Related U.S. Application Data (60) Provisional application No. 60/652,842, filed on Feb. 14, 2005.

(51) Int. Cl.
*H03K 19/10* (2006.01)
*G11C 11/36* (2006.01)

(52) U.S. Cl. ............ 326/134; 326/135; 341/155; 365/175

(58) Field of Classification Search ........ 326/133–135; 365/175
See application file for complete search history.

(56) References Cited

U.S. PATENT DOCUMENTS

| | | | | |
|---|---|---|---|---|
| 5,313,117 A | * | 5/1994 | Maezawa | 326/134 |
| 5,444,751 A | * | 8/1995 | Sage | 377/78 |
| 5,698,997 A | * | 12/1997 | Williamson et al. | 326/134 |
| 5,815,008 A | * | 9/1998 | Williamson et al. | 326/134 |
| 5,825,240 A | * | 10/1998 | Geis et al. | 327/570 |
| 6,316,965 B1 | * | 11/2001 | Jonker et al. | 326/134 |
| 6,509,859 B1 | * | 1/2003 | van der Wagt | 341/155 |
| 2001/0048381 A1 | * | 12/2001 | Broekaert | 341/155 |

OTHER PUBLICATIONS

Auer U, Janβen G, Agethen M, Reuter R, Prost W, Tegude FJ, "A novel 3-D integrated RTD-HFET frequency multiplier", *IEEE*, 1997, 373-375, month unknown.

Bandyopadhyay S, Menon L, Kouklin N, Williams PF, Ianno NJ, "Self-assembled networks with neural computing attributes," *Institute of Physics Publishing*, 2002, 11:761-766, month unknown.

Bandyopadhyay S, Roychowdhury VP, Janes DB, "Chemically self-assembled nanoelectronic computing networks," *International Journal of High Speed Electronics*, 1998, 9(1):1-35, month unknown.

Hänggi M, Chua LO, "Cellular neural networks based on resonant tunnelling diodes," *International Journal of Circuit Theory and Applications*, 2001, 29:487-504, month unknown.

Karahaliloğlu K, Balkir S, Pramanik S, Bandyopadhyay S, "A Quantum Dot Image Processor," *IEEE Transactions of Electron Devices*, 2003, 50(7):1610-1616, month unknown.

(Continued)

*Primary Examiner*—Vibol Tan
(74) *Attorney, Agent, or Firm*—Needle & Rosenberg, P.C.

(57) ABSTRACT

A method and state stabilizer for enhancing computing functionality by using fast excitations are described. The state stabilizer includes a voltage source for producing fast excitations having an associated excitation amplitude. An electronic device having an associated negative differential resistance region is also included. The excitation amplitude is greater than a width of the negative differential resistance region.

16 Claims, 10 Drawing Sheets

OTHER PUBLICATIONS

Roychowdhury VP, Janes DB, Bandyopadhyay S, Wang X, "Collective Computational Activity in Self-Assembled Arrays of Quantum Dots: A Novel Neuromorphic Architecture for Nanoelectronics," *IEEE Transactions on Electron Devices*, 1996, 43(10):1688-1699, month unknown.

Skinner JE, Molnár M, "Event-related dimensional reductions in the primary auditory cortex of the conscious cat are revealed by new techniques for enhancing the non-linear dimensional algorithms," *International Journal of Psychophysiology*, 1999, 34:21-35, month unknown.

Sun JP, Haddad GI, Mazumder P, Schulman JN, "Resonant Tunneling Diodes: Models and Properties," *Proceedings of the IEEE*, 1998, 86940:641-661, month unknown.

\* cited by examiner

(Prior Art)

$$\Delta > V_{NDR}$$

| Purpose | Fingerprint Sensing | | Corner Detection | | Shape Recognition | |
|---|---|---|---|---|---|---|
| Device Type | *Conventional* | *RTD System* | *Conventional* | *RTD System* | *Conventional* | *RTD System* |
| Device Type | νMOS | RTD*+MOS | MOS | RTD*+MOS | MOS | RTD* + MOS |
| Devices/Cell | 4 νMOS 119 MOS | *6 RTD 30 MOS* | 8 bit x 71 | *3 RTD (8bit x 16)* | 8 bit x 71 | *3RTD (8bit x 16)* |
| Design Rule | 0.65 μm | 0.65 μm | 0.7 μm | 0.7 μm | 1.0 μm | 1.0 μm |
| Pixel | 25 x30 | 25 x 30 | 256 x 256 | 256 x 256 | 8 x 8 | 8 x 8 |
| Chip Size | 4 mm² | 4 mm² | 4.53 mm² | 4.53 mm² | 6.91 mm² | 6.91 mm² |
| Clock rate | 5 kHz | *100 MHz* | 100 MHz | 100 MHz | 35 MHz | *100 MHz* |

METHOD AND APPARATUS FOR STABILITY CONTROL USING FAST EXCITATION IN CIRCUITS HAVING ELEMENTS WITH NEGATIVE DIFFERENTIAL RESISTANCE

CROSS REFERENCE TO RELATED APPLICATIONS

This application claims priority to a U.S. Provisional Patent Application with application No. 60/652,842 entitled "METHOD AND APPARATUS FOR STABILITY CONTROL USING FAST EXCITATIONS IN CIRCUITS HAVING ELEMENTS WITH NEGATIVE DIFFERENTIAL RESISTANCE," which was filed on Feb. 14, 2005. This application is hereby incorporated by reference in its entirety.

BACKGROUND

Figure 1A:
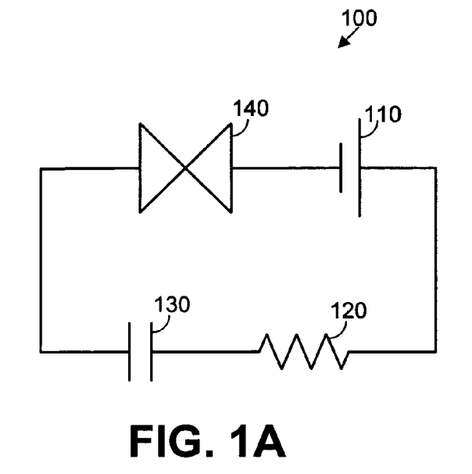
FIG. 1A is a circuit diagram for a conventional circuit with a DC power source, inductor, capacitor, and resonant tunneling diode (RTD).

FIG. 1A is a circuit diagram for a conventional circuit 100 with a DC power source 110, inductor 120, capacitor 130, and resonant tunneling diode (RTD) 140. The presence of the RTD 140 creates instability in the circuit 100 that is more clearly seen in FIG. 1B. This figure is a graph of the current voltage relationship, which is commonly referred to as an I-V curve, for the RTD 140. For a first region labeled 142, the current increases up to a peak current $I_p$ that has an associated peak voltage $V_p$. In contrast, the current within a region labeled 144 decreases with increasing voltage to a valley current $I_v$ that has an associated valley voltage $V_v$. Finally, the current increases again with increasing voltage in a region labeled 146 beyond the valley current $I_v$. Because resistance is the ratio of voltage to current, analyzing the I-V curve in FIG. 1B indicates how the resistance in the circuit 100 varies.

Figure 1B:
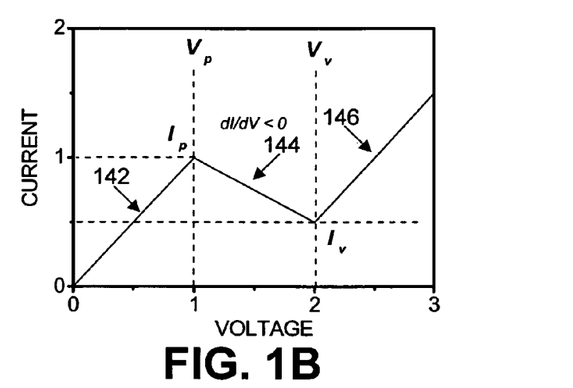
FIG. 1B is a graph of a current voltage relationship, for the RTD of FIG. 1A.

The behavior of the circuit 100 in the 144 region is caused primarily by the RTD 140 and the quantum mechanical phenomenon called tunneling. In essence, tunneling is the quantum mechanical process by which a particle can penetrate a classically forbidden region of space (for example, passing from two separate points A and B without passing through intermediate points). The phenomenon is so named because the particle, in traveling from A to B, creates a sort of "tunnel" for itself, bypassing the usual route. As indicated in FIG. 1B, tunneling occurs during the region labeled 144, which consequently results in the current decreasing with increasing voltage. This region is generally referred to as the region of negative differential resistance (NDR). One skilled in the art can appreciate that the NDR depicted in region 144 means that $$\frac{dV}{dI} < 0$$

because the first derivative represents the slope of the line. Therefore, $$\frac{dV}{dI}$$

is the differential resistance.

The NDR region for RTDs can be both an advantage and a disadvantage in modern computing applications. When the RTD is used in amplifier devices, the NDR region can be quite helpful. In contrast, the NDR's existence creates a host of problems when used in logic devices, such as AND gates, OR gates, and NOR gates. One of the primary characteristics of these gates is that they produce a consistent output for a given input. In other words, logic devices must be stable. Because the NDR is by its nature unstable, using an RTD in a logic device is considerably limiting.

Figure 1C:
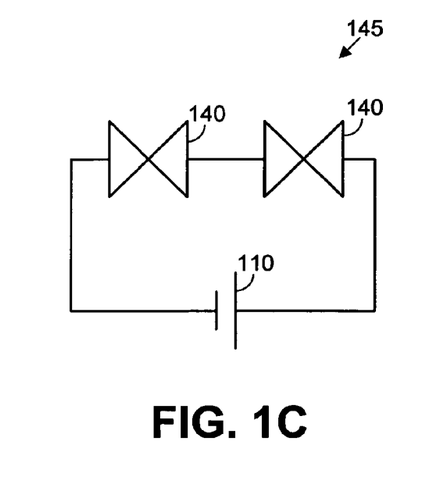
FIG. 1C is a circuit diagram for a conventional circuit with two RTDs and a DC source.
Figure 1D:
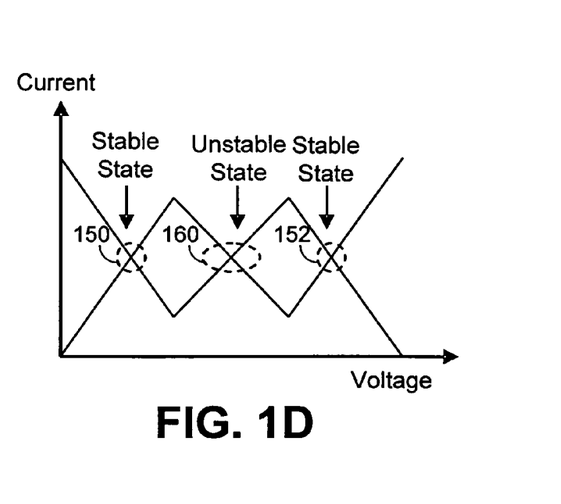
FIG. 1D illustrates the corresponding I-V curves for the circuit of FIG. 1C.

In other words, RTDs can only be used in logic devices within its stable regions (i.e., region 142 and region 146). This is more clearly seen with reference to FIG. 1C and FIG. 1D. In FIG. 1C, the circuit 145 includes two RTDs 140 and a DC source 110. FIG. 1D illustrates the corresponding I-V curves for this circuit. In essence, the circuit 145 creates two stable states 150, 152 and an unstable state 160. Hence, the RTDs 140 can be used in the regions that include the stable states 150, 152 but cannot be used in the NDR region that includes the unstable state 160. This inherent characteristic of the RTD considerably limits its use. Thus, there remains an unmet need among conventional devices.

BRIEF DESCRIPTION OF THE DRAWINGS

FIGS. 3A-3C are graphs that illustrate how the effective resistance $\bar{R}$ and the differential resistance $$\frac{dV}{dI}$$

for the RTD of FIGS. 2B-2C vary with varying excitation amplitudes $\Delta$ and excitation frequencies $\Omega$.

While the invention is susceptible to various modifications and alternative forms, specific embodiments have been shown by way of example in the drawings and subsequently are described in detail. It should be understood, however, that the description herein of specific embodiments is not intended to limit the invention to the particular forms disclosed. In contrast, the intention is to cover all modifications, equivalents, and alternatives falling within the spirit and scope of the invention as defined by the appended claims.

DETAILED DESCRIPTION OF EMBODIMENTS

Description of the Method

Figure 2A:
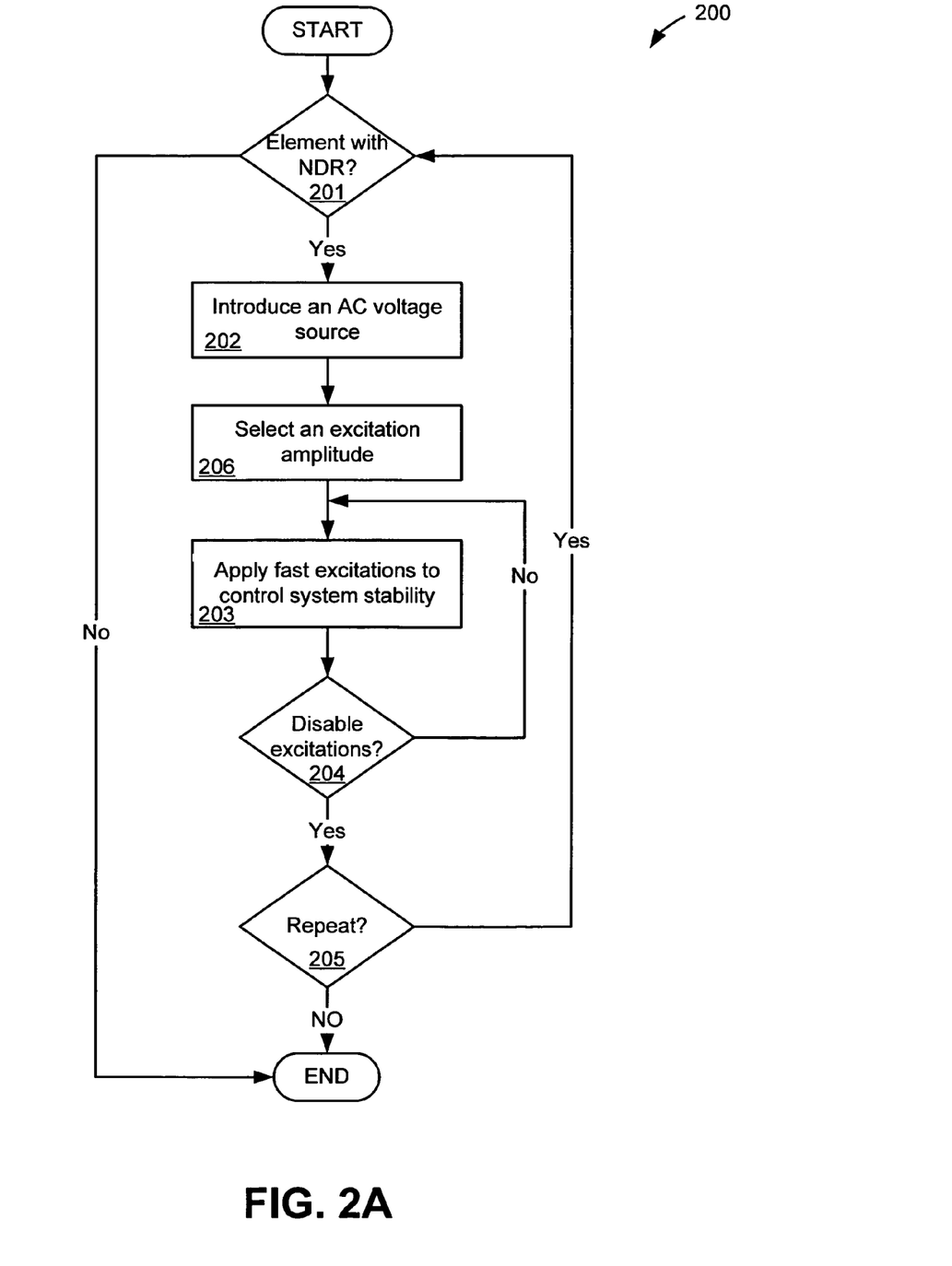
FIG. 2A is a flow chart illustrating a method of stabilizing a system that includes circuit elements with negative differential resistance.

FIG. 2A is a flow chart 200 illustrating a method of stabilizing a system that includes circuit elements with negative differential resistance. The system associated with this method is described in greater detail as it relates to subsequent figures. Any process descriptions or blocks in flow charts can be understood as representing modules, or segments, which can include one or more executable instructions for implementing specific logical functions or blocks in the process. Alternative implementations are included within the scope of the invention in which functions can be executed out of order from that shown or discussed, including substantially concurrently or in reverse order, depending on the functionality involved, as can be understood by those reasonably skilled in the art.

The method begins at block 201 by determining whether there is an element in an associated system that has a region of negative differential resistance (NDR). To complete this block, each element within the system can be identified by circuit analyzers such as SPICE, Tina-TI, or the like and compared with a list of devices known to have an NDR region. Devices known to have an NDR region can include, but are not limited to tunneling diodes (e.g., resonant tunneling diodes), tunnel diodes, Esaki diodes, Gunn diodes, molecular electronic devices, single electron devices, any circuit having the combination of any above devices. If there are no elements within the system that have an NDR region, the "No" branch is followed from block 201 to the end block, which causes the method to finish.

If there are elements with NDR, the "Yes" branch is followed from block 201 to block 202. In block 202, an AC voltage source is introduced into the system. The specifics of this voltage source is described in detail below with reference to FIG. 2B. To complete this block, a signal can be sent to a controller for the AC voltage source that prompts introduction of the AC voltage source. Alternatively, the AC voltage source can be set on a timer, such that a signal is automatically introduced at some designated time.

Block 202 is followed by block 206, where an excitation amplitude is selected. An excitation amplitude generally refers to the amplitude of the pulses emitted from the voltage source described with reference to block 202. Selecting an excitation amplitude generally involves determining the width of the NDR and choosing an excitation amplitude that is greater than the width of the NDR. This is described in more detail with reference to FIGS. 3A-3C.

Block 206 is followed by block 203, which involves applying fast excitations to control the system's stability. Fast excitations, as used herein, refers to applying voltage signals at frequencies, or rates, that are significantly higher than a system's natural frequency $\omega$. One skilled in the art can appreciate that every electrical system has an associated natural frequency. Applying voltage signals at the high frequencies used with fast excitation changes the system's effective resistance to one that is averaged by time, which is also described herein. To apply these fast excitations, the same previously described AC voltage source can be used by increasing the frequency, such that fast excitations are emitted. Alternatively, another AC source can be added for the sole purpose of generating fast excitations.

Block 203 is followed by block 204, which determines whether the excitations should be disabled. Factors affecting this decision can vary depending on the type of system that uses the current method and the particular logic function to be implemented. For example, when the method is used with an enhanced flip-flop, which is described with reference to FIG. 4A, the fast excitations can be applied only until a desired third output state is generated. Factors affecting this decision can include system stability control measurements including, but not limited to, system power stability control and/or any hybrid methods. When the excitations should not be disabled, the "No" branch is followed from block 204 back to block 203, which is repeated.

If the excitations should be disabled, the "Yes" branch is followed from block 204 to block 205, which determines whether the entire method should be repeated. Factors affecting this decision can be whether the method is scheduled to repeat after a certain amount of time has lapsed. Alternatively, this method can repeat when an error occurs. If the method repeats, block 205 is followed by block 201. Otherwise, the "No" branch is followed to the end block.

The method associated with the flow chart 200 can be implemented in several different ways. In one embodiment, the method can be implemented as stabilization software 910 with a computing environment 900 (see FIG. 9). In another alternative embodiment, this method can be implemented using discrete logic devices designed to perform each of the individual blocks, such as binary adders, digital comparators, digital counters, digital dividers, any discrete logic device, which utilizes a controlled binary counter and strategically designed output logic, can often fulfill the task of the microcontroller. This type of state machine can frequently be implemented with a single programmable logic device (PLD).

Description of the System

Figure 2B:
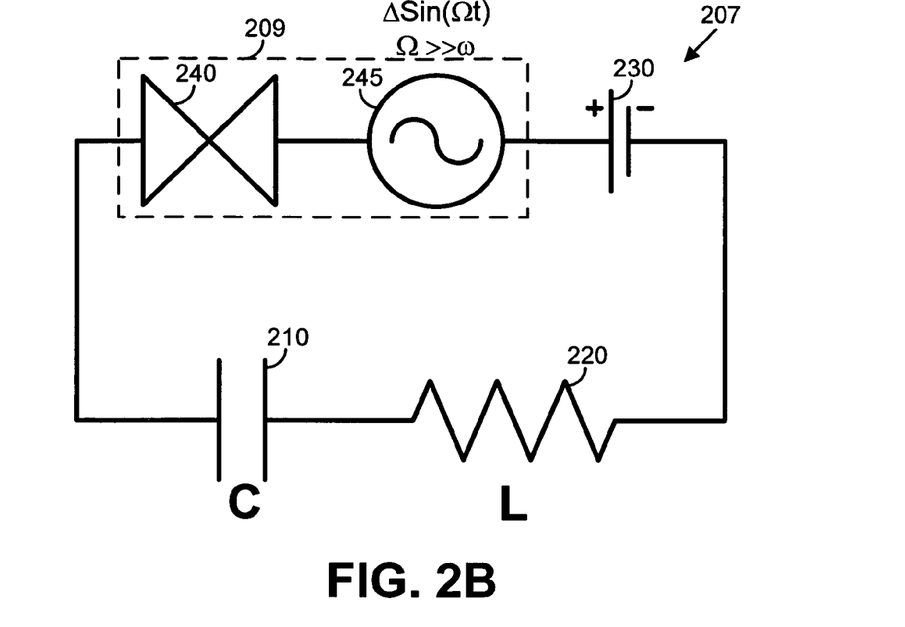
FIG. 2B is a circuit diagram that includes a state stabilizer for enhancing computing functionality by using fast excitations in accordance with the present invention.
Figure 2C:
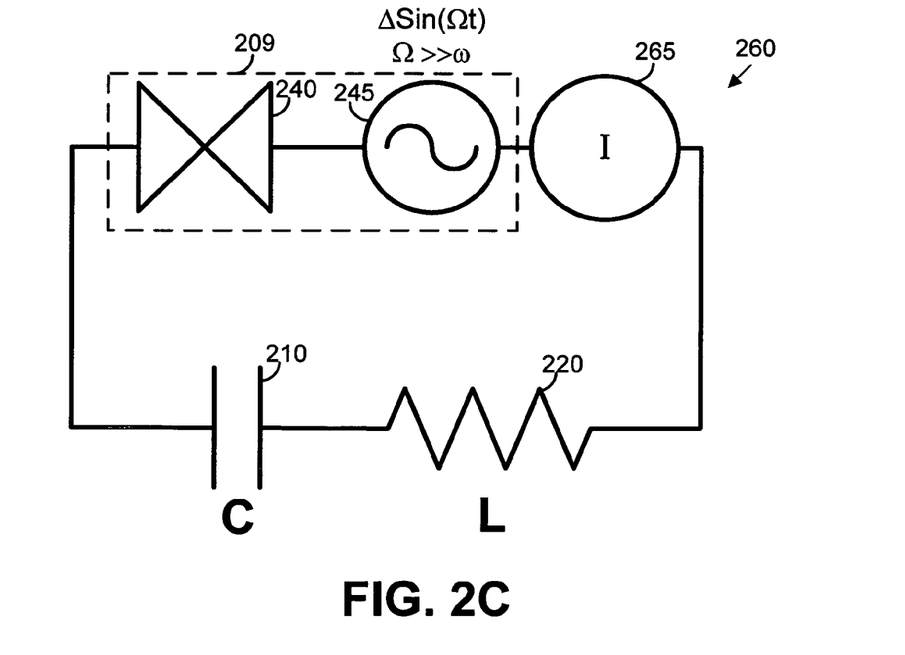
FIG. 2C is an alternative embodiment for the circuit of FIG. 2B illustrating a circuit that uses a constant current source instead of the DC power source of FIG. 2B.

FIG. 2B is a circuit diagram 207 that includes a state stabilizer 209 for enhancing computing functionality by using fast excitations in accordance with the present invention. The circuit 207 can include a capacitor 210, inductor 220, and DC power source 230. These devices can be any type of conventional devices. The circuit 207 also includes a resonant tunneling diode (RTD) 240. In addition, the circuit 207 includes an AC power source 245 that is characterized by the equation $V=\Delta \sin(\Omega t)$ where $\Omega \gg \omega$. One skilled in the art can appreciate that $\Delta$ is the amplitude of the AC voltage V, $\Omega$ is the frequency of AC voltage V, and $\omega$ is the eigen frequency, or natural frequency, of the circuit 207. The AC power source 245 sends periodic signals to the RTD 240; these two devices form the state stabilizer 209. Though shown as including the RTD 240 and the AC source 245, this state stabilizer generally includes at least one device with an NDR and a voltage source for supplying fast excitations. Consequently, there can include any of the above-mentioned NDR devices. Turning now to FIG. 2C, this figure is an alternative embodiment for the circuit 207 illustrating a circuit 260 that uses a constant current source 265 instead of the DC power source 230 used in circuit 207. Because circuit 260 is functionally equivalent to circuit 207 and both include the state stabilizer 209, the remaining description is equally applicable to either circuit.

Because the circuit 260 is functionally equivalent to the circuit 207 and both include the state stabilizer 209, the remaining description is equally applicable to either circuit. The behavior of these circuits are characterized by the equation $$L\ddot{q} + R^*\dot{q} + \frac{1}{C}q = -(E + \Delta\sin\Omega t)$$

where R* is the nonlinear resistance of the RTD 240. The resistance of an RTD is a function of the applied voltage, which lends itself to use with fast excitations, or intermittent voltages, associated with the AC source 245. For the RTD 240, the effective resistance with fast excitations can be characterized by the equation $$\overline{R} = \omega \int_0^{1/\omega} R(V + \Delta\sin(\Omega t))dt$$

when $\Omega >> \omega$. Applying fast excitations when $\Omega >> \omega$ makes the effective resistance one that is averaged by time. The effective differential resistance is $$\omega \int_0^{1/\omega} \frac{dV}{dI} dt$$

and $V = \Delta \sin(\Omega t)$. Therefore, both the effective resistance $\overline{R}$ and the effective differential resistance $$\omega \int_0^{1/\omega} \frac{dV}{dI} dt$$

are functions of an excitation amplitude $\Delta$. Hence, varying the excitation amplitude varies both the effective resistance $\overline{R}$ and the effective differential resistance $$\omega \int_0^{1/\omega} \frac{dV}{dI} dt.$$

Figure 3A:
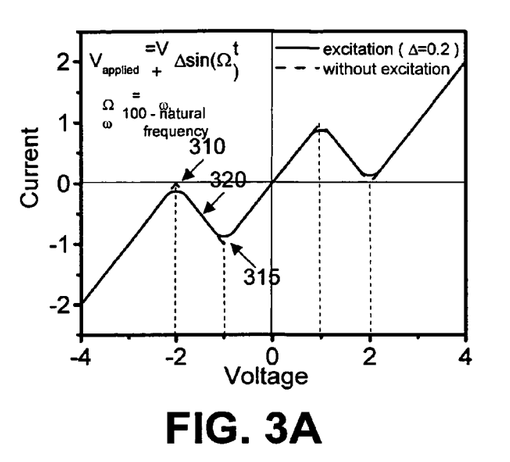
Figure 3B:
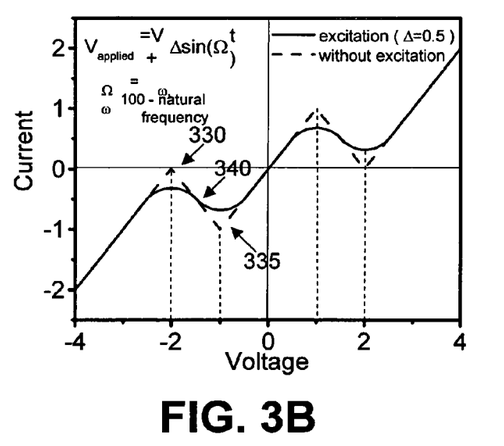
Figure 3C:
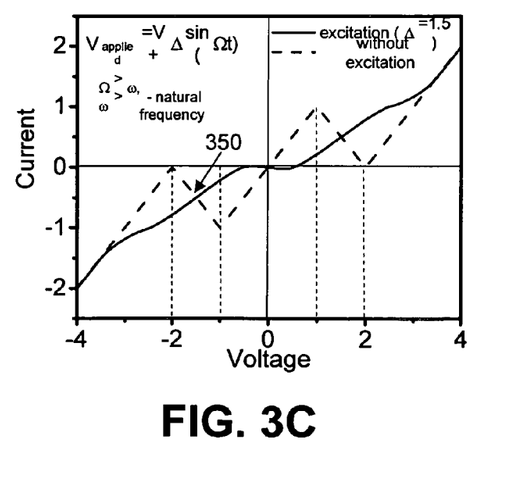

Turning now to FIGS. 3A-3C, these figures illustrate how the effective resistance $\overline{R}$ and the differential resistance $$\frac{dV}{dI}$$

for the RTD 240 vary with changing excitation amplitudes $\Delta$ and excitation frequencies $\Omega$. In FIG. 3A, the excitation amplitude $\Delta$ is 0.2 and the excitation frequency $\Omega$ is 100ω. In this graph, the dashed line depicts the RTD's current in the absence of excitation, which means without the AC source 245 (see FIGS. 2B-2C). In contrast, the solid line in FIG. 3A depicts the RTD's current when the excitation is such that $\Delta = 0.2$ and $\Omega = 100\omega$. This amount of excitation only causes the RTD's current to vary slightly at the peak voltage (see 310) and the valley voltage (see 315) for that particular cycle. One skilled in the art can appreciate that this figure shows two cycles instead of the single cycle shown in FIG. 1B. Despite the slight change around those peak and valley voltages, the effective differential resistance $$\frac{dV}{dI}$$

is still less than zero (see 320). For this amount of excitation, there is only a nominal change in the differential resistance $$\frac{dV}{dI}$$

and effective resistance $\overline{R}$.

By increasing the excitation amplitude $\Delta$ to 0.5 and maintaining the same excitation frequency $\Omega$ as shown in FIG. 3B, the change in the effective differential resistance $$\frac{dV}{dI}$$

and the effective resistance $\overline{R}$ becomes more pronounced. More specifically, there is a greater divergence around the peak voltage (see 330) and valley voltage (see 335) when the excitation amplitude $\Delta$ approaches the voltage difference between the peak and valley. In other words, $|V_p - V_v| \approx \Delta$, when $\Delta = 0.5$ such that the excitation amplitude is approaching the width of the negative differential resistance region. Consequently, in the effective differential resistance $$\frac{dV}{dI}$$

is approaching zero. Therefore, the negative differential resistance region described with reference to FIG. 1B is considerably smaller in FIG. 3B.

FIG. 3C illustrates an increase in the excitation amplitude $\Delta$ to 1.5 and the excitation frequency $\Omega$ to $\Omega >> \omega$. Now, $|V_p - V_v| < \Delta$ because $|V_p - V_v| = 1$, which is less than the excitation amplitude $\Delta = 1.5$. Together, these constraints produce a positive effective differential resistance $$\left(i.e., \frac{dV}{dI} > 0\right)$$

as shown at 350, despite the previously negative value (see 340 in FIG. 3B). Because the previous negative differential resistance region (NDR) created an unstable state, selecting an excitation amplitude of $\Delta = 1.5$ and an excitation frequency $\Omega$, where $\Omega >> \omega$, creates a stable state where a previously unstable state existed (i.e., the NDR region). Hence, this specific data can be used to identify conditions where a stable state can be created.

The state stabilizer 209 can create a stable state for an RTD 240 from a previously unstable state using two conditions. The excitation amplitude $\Delta$ is chosen to be greater than the width of the NDR region, or the difference between the peak voltage $V_p$ and valley voltage $V_v$ (i.e. $|V_p-V_v|<\Delta$). The excitation frequency $\Omega$ is chosen to be much greater than the natural frequency $\omega$, such that a circuit's output is not a function of the natural frequency $\omega$. For example, the excitation frequency $\Omega$ can be at least approximately two orders of magnitude greater than the natural frequency $\omega$, three orders of magnitude greater, or some other suitable number. FIGS. 3A-3C illustrate that satisfying these conditions creates a stable state. In an alternative embodiment, a stable state can be created from satisfying these conditions in addition to satisfying other conditions.

Figure 4A:
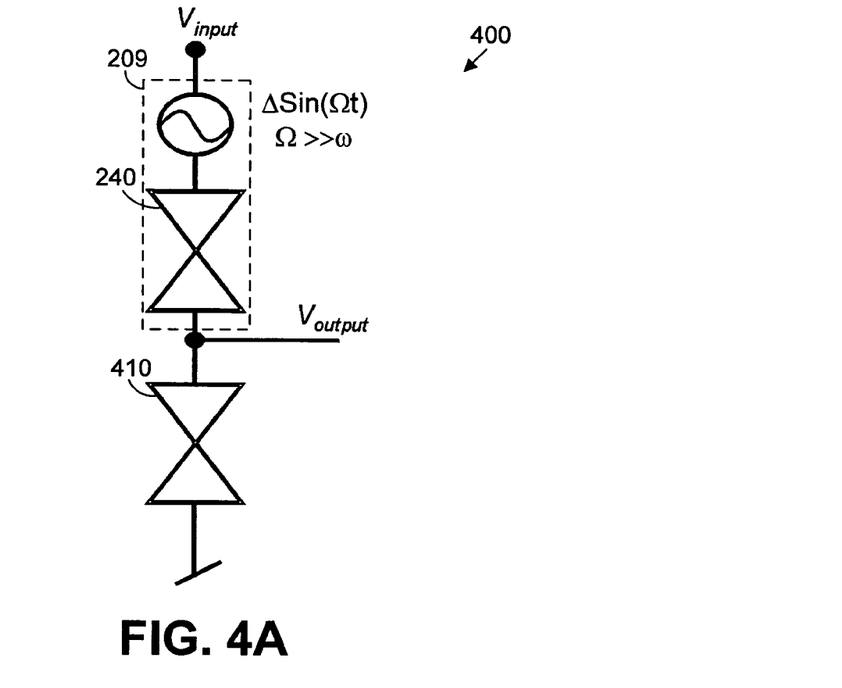
FIG. 4A is a circuit diagram for an enhanced logic circuit that includes the state stabilizer if FIGS. 2B-2C and an addition RTD.

Turning now to FIG. 4A, this illustrates a circuit diagram for an enhanced logic circuit 400 that includes the state stabilizer 209 and an additional RID 410. A conventional RTD based flip-flop circuit maintains its state indefinitely until an input pulse called a trigger is received. If a trigger is received, the conventional circuit changes to its other state according to predefined rules and remains in that state until another trigger is received. Since the logic circuit 400 incorporates the state stabilizer 209, this logic circuit can have a third output state when the above-mentioned stability conditions are satisfied. When the conditions for a stable state are not satisfied, the logic circuit 400 can behave like a conventional flip-flop circuit.

Figure 4B:
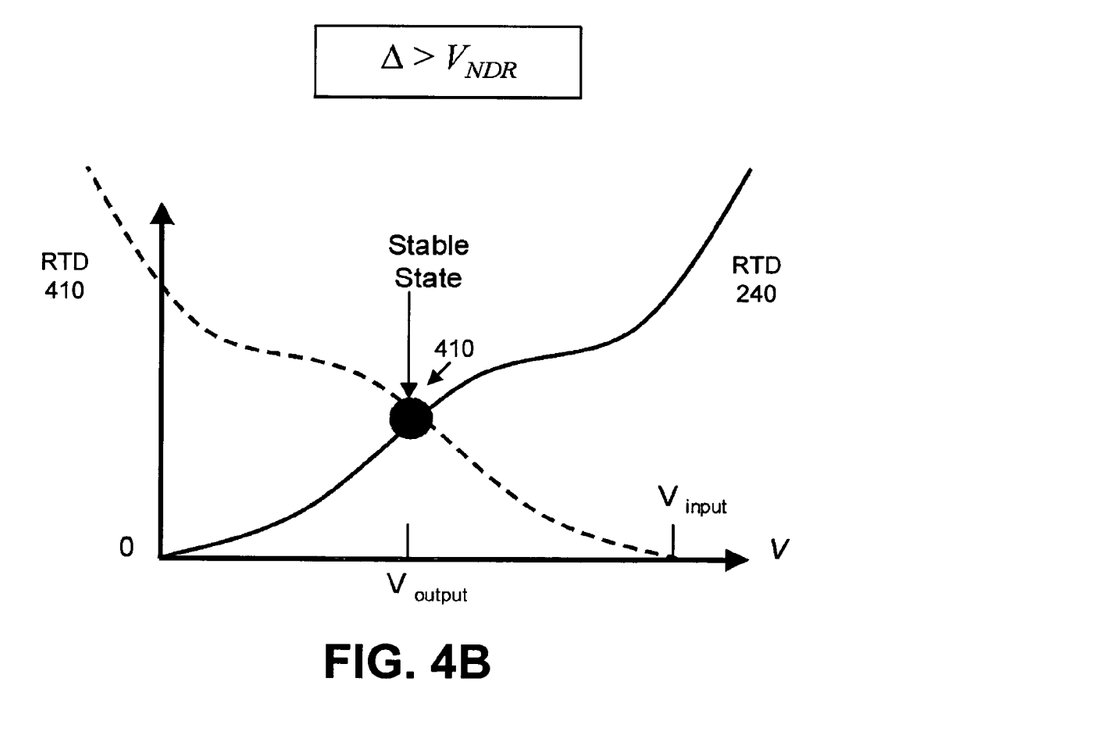
FIG. 4B is a graph illustrating the behavior of FIG. 4A.

FIG. 4B is a graph illustrating the behavior of the logic circuit 400. A stable state is created at the point 410 when the excitation amplitude $\Delta>|V_p-V_v|$ and the excitation frequency $\Omega$ is much greater than the natural frequency $\omega$. In the absence of these conditions, the logic circuit 400 has a stable state associated with the RTD 240 at point 150 and a stable state associated with RTD 410 at point 152 (See FIG. 1D). Flip-flops are elementary logic circuits that can be used as building blocks for integrated circuits. Examples of an integrated circuit that uses flip flops as building blocks can include signal amplifiers, frequency dividers, and other suitable integrated circuits. Because the enhanced logic circuit 400 can produce three different outputs, this logic circuit facilitates more efficient coding of information, which can enhance logic functionality.

Description of the State Stabilizer's Applications

The invented state stabilizer 209 has a host of applications, and the applications in this section are shown for illustrative purposes only, but the scope is not limited to the described applications.

Applications to Image Processing

Figure 5A:
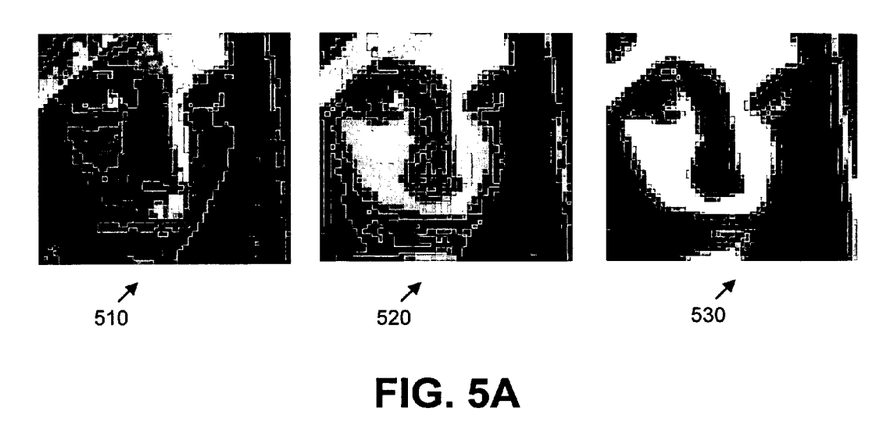
FIGS. 5A-5C, illustrate how the state stabilizer of FIGS. 2B-2C can be used to improve image processing.
Figure 5B:
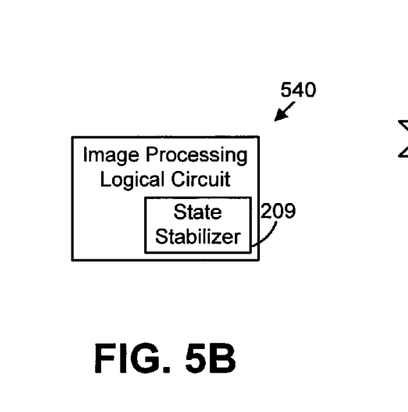
Figure 5C:
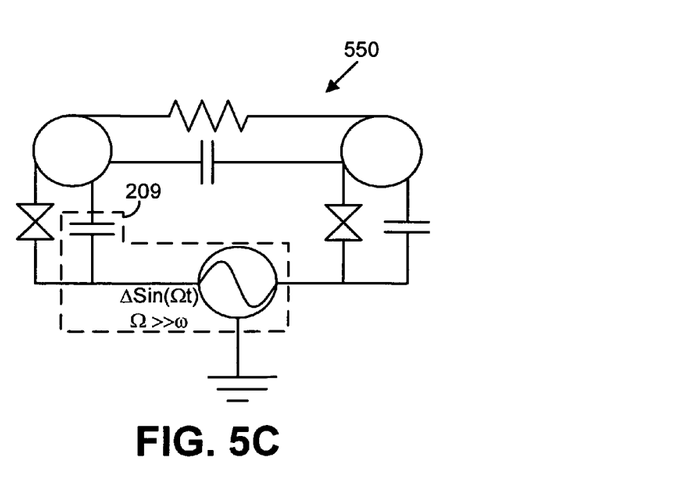

Turning now to FIGS. 5A-5C, these figures illustrate how the state stabilizer 209 can be used to improve image processing. In FIG. 5A, an original gray scale image 510 is converted to an intermediate image 520, and a final black and white image 530. To accomplish the transition from image 510 to image 530 at an enhanced rate, an image processing logical circuit 540 that includes the state stabilizer 209 can be used (see FIG. 5B). A circuit diagram 550 (see FIG. 5C) illustrates one example of the image processing logic circuit 540 that includes the state stabilizer 209 along with some other circuit elements. This logic circuit 550 can be used for various types of image processing including fingerprint sensing and corner detection.

Figure 6:
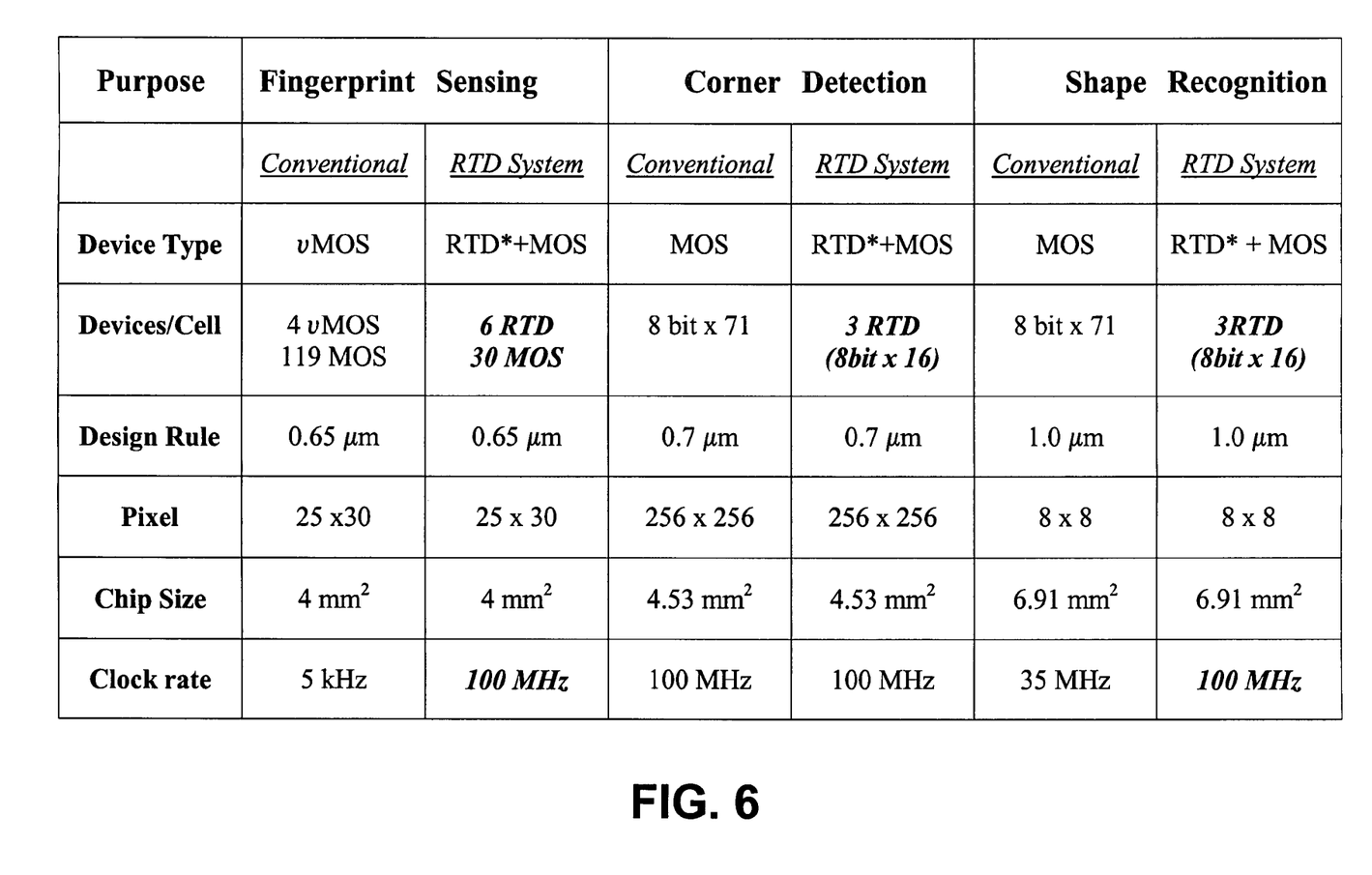
FIG. 6 is a table illustrating how certain criteria such as device type, devices per cell, design rule, number of pixels, chip size, and clock rate can vary depending on the type of image processing and whether the state stabilizer of FIGS. 2B-2C is implemented.

While FIG. 5A illustrates only one aspect of image processing known as contrast enhancement, the state stabilizer 209 is equally applicable to other aspects of image processing including fingerprint sensing, corner detection, shape recognition and other suitable types of image processing. Moreover, using a state stabilizer 209 in logic circuits for these kinds of applications can reduce the number of devices per unit area and improve other factors like clock rate. Turning now to FIG. 6, this figure illustrates how certain criteria such as device type, devices per cell, design rule, number of pixels, chip size, and clock rate can vary depending on the type of image processing and whether the state stabilizer 209 is implemented. This table is only illustrative of the potential differences that using the state stabilizer 209 can create and is greatly dependent on circuit design. For example, using state stabilizers in fingerprint sensing can reduce the number of devices per cell to a total of thirty-six instead of 123. In addition, the clock rate can be at least an order of magnitude faster when using state stabilizers in both fingerprint sensing and shape recognition. Because the state stabilizer 209 allows encoding of black, white, and grey pixels, it creates a considerable enhancement in image processing.

Application to Associative Memory

In addition to image processing, the state stabilizer 209 can be used in associative memory applications. Generally, associative memory refers to a digital process by which a computing device uses a compressed input image where data is missing, along with a memory selection device, to identify the complete original image. More specifically, an associative memory is a system which holds copies of distinct signal sets x(p), p=1, 2, ... k in its internal state and later produces the copy of a particular set to the output. Producing the set occurs when the inputs are excited by a set of signals in which a specified subset of the values matches with the corresponding subset of the produced set. The general task of associative memory (AM) is to choose one of the signals or states stored in the internal space, which is most similar to the given input. By using the state stabilizers 209, an enhanced associative memory system 700 (see FIG. 7) can identify the original image at considerably faster rates than traditional systems.

Figure 7:
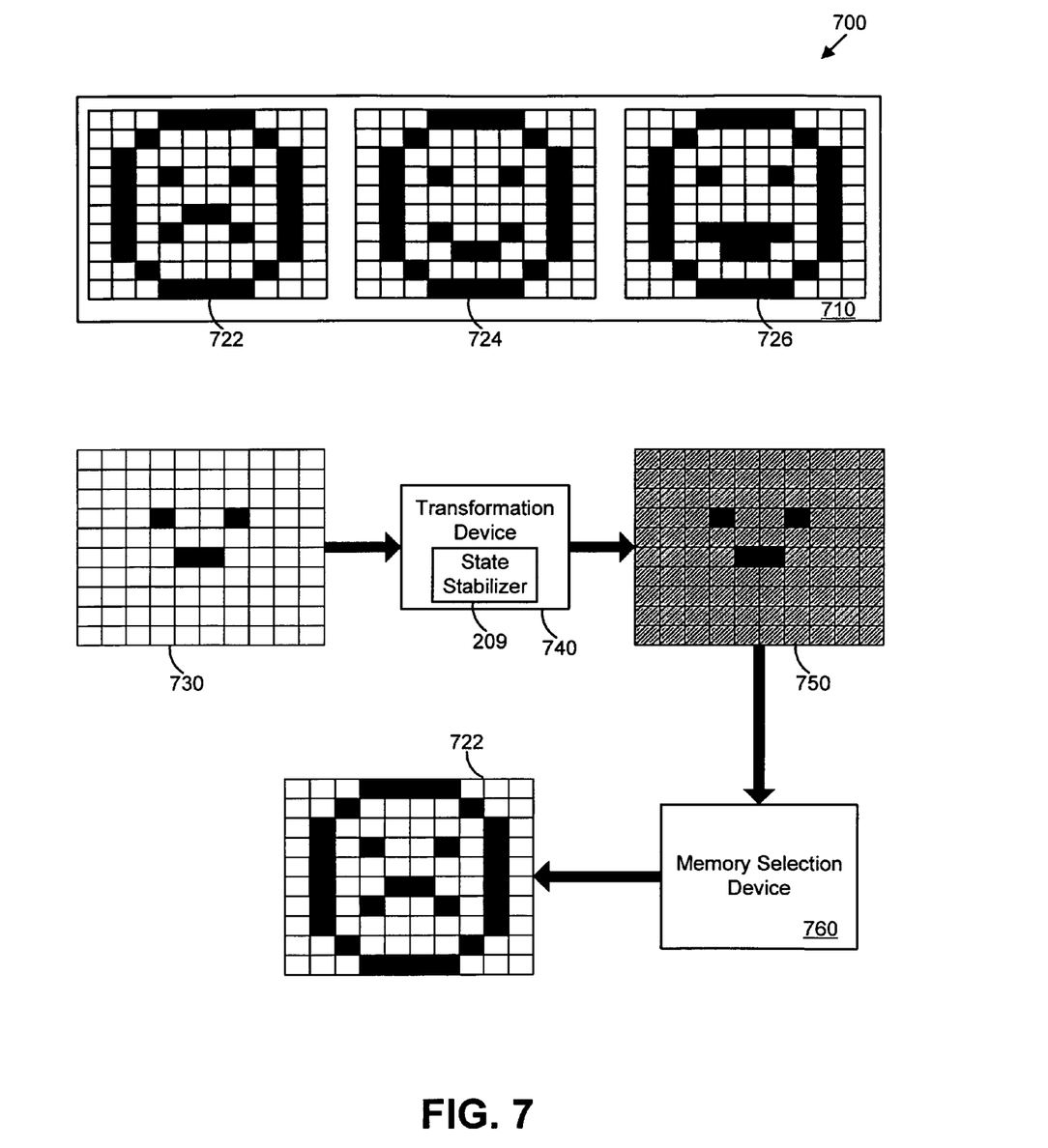
FIG. 7 is a block diagram illustrating an enhanced associative memory system with a state stabilizer FIGS. 2B-2C.

Turning now to FIG. 7, this figure illustrates the enhanced associative memory system 700, which includes a memory storage device 710 that has image 722, image 724, and image 726. A previous action within the associative memory system 700 resulted in these images being placed in the memory storage device 710.

At some point, the enhanced associative memory system 700 is notified that the original image for a compressed image 730 should be retrieved. Like images 722-726, image 730 can also be stored in the memory storage device 710, though not shown. This notification can result from a user-induced action, associative memory recall, or the like. To determine which of the images in the memory storage device 710 corresponds to the original image, the memory system 700 sends the image to an image transformation device 740 that includes the state stabilizer 209. Essentially, this device notes that data is missing from the retrieved image 730; for example, the transformation device 740 can note that data is missing for all the pixels in this retrieved image except the four black pixels. Because the enhanced associative memory system 700 uses the state stabilizer 209, it has three-level encoding, which allows recording of each pixel as 0, 1, or a missing bit. The image transformation device 740 can perform artificial state stabilization on all pixels labeled as a missing bit. In other words, the image transformation device 740 converts all of the missing data pixels to a grayscale data pixel and then reproduces the image. More specifically, the missing data pixel is attributed to a third stable state 410, as previously described. Then the state stabilizer 209 is deactivated such that the resulting state is a superposition of stable point 150 (which can correspond to a zero) and stable point 152 (which can correspond to a one). Repeating this for every missing data pixel creates the grayscale image 750.

The enhanced associative memory system 700 then uses a grayscale image 750 as the basis for selecting the appropriate image from memory. That is, the grayscale image 750 is the input image that is sent to a memory selection device 760. This device compares all the pixels in the grayscale image 750 with the corresponding pixel in the compressed image 730 and selects the image with the most pixels in common. In this case, the memory selection device 760 selects image 722.

By using the state stabilizer 209, the enhanced associative memory system 700 can efficiently retrieve appropriate images from its memory storage device 710, even when the input image includes a host of missing bits. Moreover, the enhanced associative memory system 700 accomplishes this objective without trying every possible value for the missing bit, which saves time. In addition, the enhanced associative memory system 700 does not have to include additional logic circuit complexity by adding circuitry to encode a missing bit in addition to encoding the zero and one. In other words, the enhanced associative memory system 700 creates substantial advantages by using the state stabilizer 209.

Application to Cellular Nonlinear Networks

Like image processing and associative memory, the state stabilizer 209 is applicable in cellular nonlinear networks. A cellular nonlinear network is a colossal computing paradigm that includes an array of cells where information is transferred only between nearest neighbor cells. Bringing cells in a cellular nonlinear network within 10 nanometers or less can result in the quantum effect known as tunneling, which can lead to a host of undesirable effects. Using the state stabilizer 209, a more enhanced cellular nonlinear network 800 (see FIGS. 8A-8B) can be created.

Figure 8A:
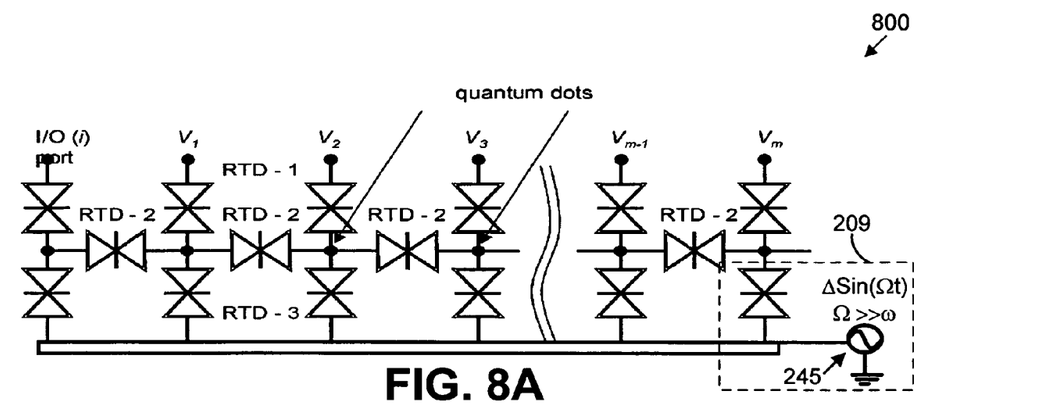
FIGS. 8A-8B are circuit diagrams illustrating an enhanced cellular nonlinear network that includes a host of state stabilizers, like the one described in FIGS. 2B-2C.
Figure 8B:
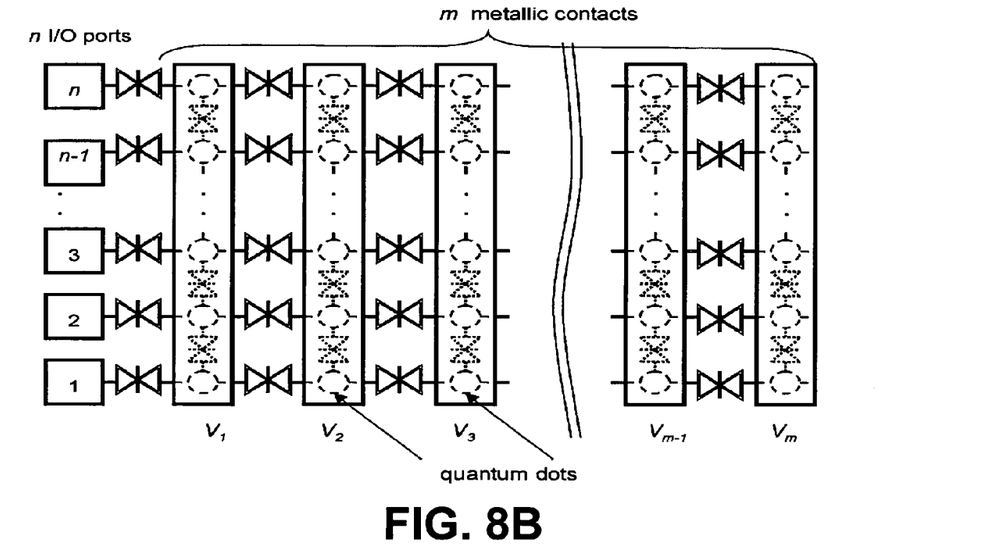

Turning now to FIGS. 8A-8B, these figures illustrate an enhanced cellular nonlinear network 800 that includes a host of state stabilizers 209 (one of which is shown). By using the state stabilizers 209, the cellular nonlinear network 207 can regulate the behavior of an array with billions of RTDs using a single AC source 245 within the state stabilizer 209. Consequently, this network can selectively control the tunneling effects that the RTDs experience. Besides the two stable points of each RTD pair (see stable point 150 and stable point 152 of FIG. 1D), it is possible to utilize the third stable point 410 (see FIG. 4B). For example, RTD-3 can experience tunneling while RTD-2s do not. By regulating tunneling, the cellular network 800 can change the functionality of a given device. For example, applying fast excitations can make that device behave like a tri-state device.

Figure 9:
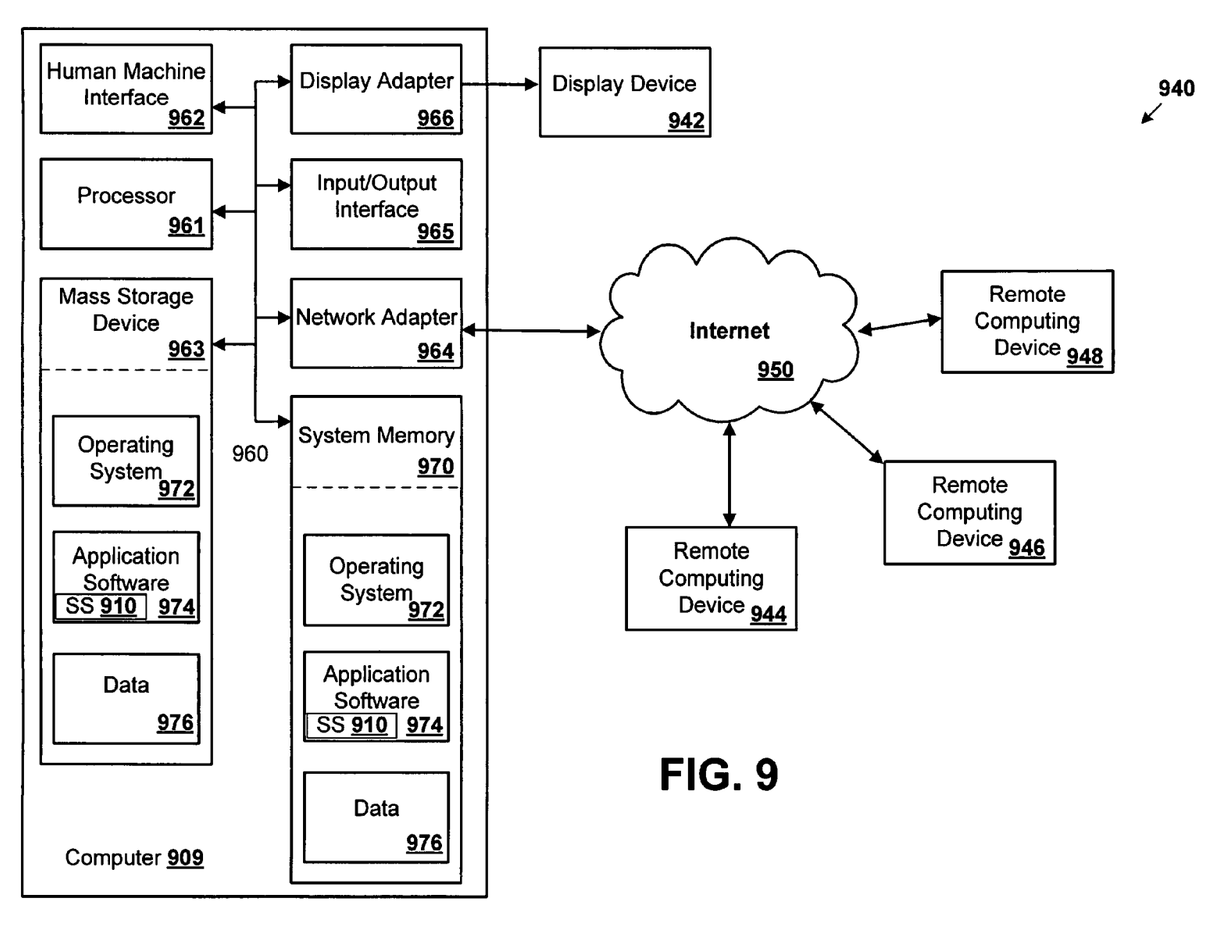
FIG. 9 is a block diagram illustrating an alternative implementation for the method described with reference to FIG. 2.

In another embodiment, the method described with reference to FIG. 2 can be implemented as stabilization software 910 described with reference to FIG. 9. This figure is a block diagram illustrating an alternative implementation for the method described with reference to FIG. 2. This implementation is only an example and is not intended to suggest any limitation as to the scope of use or functionality of the architecture. Neither should this implementation be interpreted as having any dependency or requirement relating to any one or combination of illustrated components.

The system memory 970 within the computer 909 can be operational with numerous other general-purpose or special purpose computing system environments or configurations. Thus, an environment 940 can be any one of several well known computing environments, such as personal computers, server computers, laptop devices, and multiprocessor systems. Additional examples include set top boxes, programmable consumer electronics (e.g., personal digital assistants), network PCs, minicomputers, mainframe computers, distributed computing environments that include any of the above systems or devices, and the like.

The environment 940 includes several electronic devices including a general-purpose computing device in the form of a computer 909 that houses the system memory 970. To interface with a user (not shown), the computer 909 is connected to a display device 909. In addition, the computer 909 can operate in a networked environment using logical connections to one or more remote computing devices 944-948 by using the Internet 950. These remote computing devices can be located at several different physical locations.

The display device 942 can be one of several types of display devices. For example, the display device 942 can be a CRT (cathode ray tube) display, an LCD (Liquid Crystal Display), or some other suitable type of display. In addition to the display device 942, the computer 909 can connect to other output peripheral devices, such as speakers (not shown), a printer (not shown), and the like.

A user can enter commands and information into the computer 909 via one or more input devices (not shown). The input devices can include, but are not limited to, a keyboard, pointing device (e.g., a "mouse"), a microphone, a joystick, a serial port, a scanner, and the like. These and other input devices can connect to the microprocessor 961 via the human machine interface 962, which is coupled to the system bus 960. Alternatively, this human machine interface may be connected by other interface and bus structures, such as a parallel port, game port, or a universal serial bus (USB).

Like the computer 909, the remote computing devices 940-948 can be a personal computer, portable computer, a server, a router, a network computer, a peer device, or some other suitable device. Logical connections between the computer 909 and the remote computing devices 940-948 can be made via a local area network (LAN) and a general wide area network (WAN). These networks can be wired networks, wireless networks, or the like, such as networks in offices, enterprise-wide computer networks, intranets, or on the Internet 915.

The computer 909 can include numerous components in addition to the system memory 970. For example, the computer 909 can include the system bus 960 that couples various system components to the system memory 970. Other system components can include one or more processors or processing units 961, a human machine interface 962, a mass storage device 963, a network adapter 964, input/output interface 965, and display adapter 966.

The system bus 960 represents one or more of several possible types of bus structures, including a memory bus or memory controller, a peripheral bus, an accelerated graphics port, and a processor or local bus using any of a variety of bus architectures. The architectures can include, for example, an Industry Standard Architecture (ISA) bus, a Micro Channel Architecture (CA) bus, an Enhanced ISA (EISA) bus, a Video Electronics Standards Association (VESA) local bus, and a Peripheral Component Interconnects (PCI) bus also known as a Mezzanine bus. The system bus 960 and all buses specified in this description can also be implemented over a wired or wireless network connection. Consequently, the remote devices 940-948 can include components, such as mentioned above, connected by the system bus 960, which in effect implements a distributed computing system.

In addition, the computer 909 can include a variety of accessible computer readable media. For example, this media can include volatile media, non-volatile media, removable and non-removable media depending on the type of system component that the media is used within. For example, the mass storage device 963 can use non-volatile media for storing computer code, computer readable instructions, data structures, program modules, and other data for the computer 909. Consequently, the mass storage device 963 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

For purposes of illustration, application programs and other executable program components such as the operating system 972 are illustrated herein as discrete blocks. However, it is recognized that such programs and components reside at various times in different storage components of the computing device 909, and are executed by the data processor(s) of the computer 909. An implementation of application software 974 may be stored on or transmitted across some form of computer readable media. Computer readable media can be any available media that can be accessed by a computer. By way of example, and not limitation, computer readable media may comprise "computer storage media" and "communications media." "Computer storage media" can include volatile and non-volatile, removable and non-removable media implemented in any method or technology for storage of information such as computer readable instructions, data structures, program modules, or other data. Computer storage media includes, but is not limited to, random access memory (RAM), read only memory (ROM), electrically erasable programmable ROM (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and is accessible by the computer 909.

Any number of program modules can be stored on the mass storage device 963, including by way of example, an operating system 972 and application software 974. Each of the operating system 972 and application software 974 (or some combination thereof) may include elements of the programming and the application software 974. More specifically, the application software 974 can include the stabilization software 910 described with reference to FIG. 2. Data 976 can also be stored on the mass storage device 963. Data 976 can be stored in any of one or more databases known in the art. Examples of such databases include, DB2®, Microsoft® Access, Microsoft® SQL Server, Oracle®, mySQL, PostgreSQL, and the like. These databases can be centralized or distributed across multiple systems.

The system memory 970 can include computer readable media in the form of volatile memory, such as random access memory (RAM), and/or non-volatile memory, such as read only memory (ROM). The system memory 970 typically contains data such as data 976 and/or program modules such as operating system 972 and application software 976 that are immediately accessible to and/or are presently operated on by the microprocessor 961.

The invented state stabilizer 209 creates substantial advantages using fast excitation with a host of applications. By using fast excitation, this invented state stabilizer, can add functionality to any logic device that it is incorporated within this state stabilizer. When incorporated within an image processor, the invented state stabilizers can increase the overall image processing speed while reducing the number of logic devices needed. Similarly, incorporating the invented state stabilizer in an associative memory device also improves the overall processing time. Finally, incorporating the invented state stabilizer in a cellular nonlinear network is helpful in that it enhances the network's logic functionality by providing three stable states instead of two.

The particular embodiments disclosed above are illustrative only, as the invention can be modified and practiced in different, but equivalent, manners apparent to those skilled in the art having the benefit of the teachings herein. Furthermore, no limitations are intended to the details of construction or design herein shown. It is therefore evident that the particular embodiments disclosed above can be modified and all such variations are considered within the scope and spirit of the invention.

The invention claims:

1. A state stabilizer for enhancing computing functionality by using fast excitations, comprising:
   a voltage source for producing fast excitations having an associated excitation amplitude; and
   an electronic device has an associated negative differential resistance region and is selected from the group of electronic devices consisting of resonant tunneling diodes, tunnel diodes, Esaki diodes, Gunn diodes, molecular electronic devices, single electron devices, an image process logical device comprising a memory storage device having at least one previously stored image and a transformation device that includes at least the state stabilizer, an associative memory system, a cellular nonlinear network, and a flip-flop,
   wherein the excitation amplitude is greater than a width of the negative differential resistance region.

2. The state stabilizer of claim 1, wherein the image processing logical device is operative for processing images in accordance with an image processing technique selected from the group consisting of contrast enhancement, fingerprint sensing, corner detection, and shape recognition.

3. The state stabilizer of claim 1, wherein the transformation device is operative for generating a gray scale image from a compressed image, and the associative memory system further comprises a memory selection device operative for selecting the previously stored image in response to processing the gray scale image.

4. The state stabilizer of claim 3, wherein the state stabilizer produces three different values used in producing the grayscale image and selecting the previously stored image.

5. The state stabilizer of claim 1, wherein the cellular nonlinear network includes a plurality of resonant tunneling diodes.

6. The state stabilizer of claim 5, wherein the voltage source regulates the behavior of the resonant tunneling diodes.

7. The state stabilizer of claim 1, wherein the flip-flop has three different output states.

8. A method for stabilizing a system using fast excitations, the method comprising the steps of:
- determining whether at least one device within the system has an associated negative differential resistance region;
- selecting an excitation amplitude that is greater than a width of the negative differential resistance region when it is determined that at least one device within the system has the associated negative differential resistance region;
- applying fast excitations to control system stability in response to selecting the excitation amplitude that is greater than the width of the negative differential resistance region, wherein the fast excitations have a frequency greater than a natural frequency for the system;
- determining whether the fast excitations should be disabled; and
- determining whether the method should be repeated when it is determined that the fast excitations should be disabled.

9. The method of claim 8, further comprising determining the natural frequency for the system.

10. The method of claim 8, further comprising introducing an AC voltage source into the system.

11. The method of claim 8, wherein the method is used for improving image processing using an image processing technique selected from the group of image processing techniques consisting of contrast enhancement, fingerprint sensing, corner detection, and shape recognition.

12. The method of claim 8, wherein the method is used in implementing an associative memory system.

13. The method of claim 12, further comprising the steps of:
- receiving a compressed image lacking at least one data bit;
- transforming the compressed image into a gray scale image in response to applying fast excitations to control system stability;
- processing the gray scale image; and
- selecting a previously stored image in response to processing the gray scale image.

14. The method of claim 8, wherein the method is used in implementing a cellular nonlinear network.

15. The method of claim 14, further comprising selectively controlling a plurality of resonant tunneling diodes in response to applying fast excitations to control stability.

16. The method of claim 8, wherein the method is included within instructions computer readable medium.

* * * * *